(12) United States Patent
Akieda

(10) Patent No.: US 9,095,060 B2
(45) Date of Patent: Jul. 28, 2015

(54) LAYERED STRUCTURE HAVING LAYERED CONDUCTIVE PATTERNS, MANUFACTURING PROCESS THEREOF AND TOUCHSCREEN WITH LAYERED STRUCTURE

(71) Applicant: FUJITSU COMPONENT LIMITED, Tokyo (JP)

(72) Inventor: Shinichiro Akieda, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 328 days.

(21) Appl. No.: 13/790,183

(22) Filed: Mar. 8, 2013

(65) Prior Publication Data

US 2013/0255996 A1    Oct. 3, 2013

(30) Foreign Application Priority Data

Mar. 30, 2012  (JP) ................................ 2012-081799

(51) Int. Cl.
| | | |
|---|---|---|
| *H05K 1/02* | (2006.01) | |
| *H05K 3/10* | (2006.01) | |
| *G06F 3/044* | (2006.01) | |

(52) U.S. Cl.
CPC .............. *H05K 1/0298* (2013.01); *G06F 3/044* (2013.01); *H05K 3/10* (2013.01); *Y10T 29/49155* (2015.01)

(58) Field of Classification Search
CPC ................................ H05K 1/0298; H05K 3/10
See application file for complete search history.

(56) References Cited

FOREIGN PATENT DOCUMENTS

| | | |
|---|---|---|
| JP | 2009-123106 | 6/2009 |
| JP | 2011-61136 | 3/2011 |
| JP | 2011-136562 | 7/2011 |
| JP | 2011-175900 | 9/2011 |

*Primary Examiner* — Jeremy C Norris
(74) *Attorney, Agent, or Firm* — Staas & Halsey LLP

(57) ABSTRACT

A manufacturing process for manufacturing a layered structure is provided. In the manufacturing process, transfer layers including conductive layers are transferred from transfer films so as to form a first transfer layer defining a first conductive pattern and a second transfer layer defining a second conductive pattern on a surface of a substrate, such that the first conductive layer and the second conductive layer are stacked onto each other. At least one of the first transfer layer and the second transfer layer has a non-conductive layer on a surface facing the other of the first transfer layer and the second transfer layer. The non-conductive layer is provided between the first conductive pattern and the second conductive pattern.

11 Claims, 11 Drawing Sheets

LAYERED STRUCTURE HAVING LAYERED CONDUCTIVE PATTERNS, MANUFACTURING PROCESS THEREOF AND TOUCHSCREEN WITH LAYERED STRUCTURE

CROSS-REFERENCE TO RELATED APPLICATIONS

This application is based upon and claims the benefit of the priority of the prior Japanese Application No. 2012-081799, filed Mar. 30, 2012, the entire contents of which are incorporated herein by reference.

BACKGROUND OF THE INVENTION

1. Field of the Invention

This invention relates to a layered structure having layered conductive patterns, a manufacturing process thereof and a touchscreen including such a layered structure.

2. Description of the Related Art

A layered structure including an electrode having a certain conductive pattern is used in a touchscreen, for example (see JP-A-2011-136562, JP-A-2011-175900, JP-A-2011-61136 and JP-A-2009-123106). In a known layered structure, a transparent electrode such as ITO (indium tin oxide) is generally used. A patterned electrode made of ITO is usually formed on a glass substrate by means of sputtering under vacuum atmosphere.

There is a need for an inexpensive and thin layered structure and for a manufacturing process thereof. There is also a need for a touchscreen having such a layered structure.

SUMMARY OF THE INVENTION

According to one aspect, a manufacturing process for manufacturing a layered structure having layered conductive patterns is provided. The manufacturing process includes transferring a first transfer layer onto a substrate from a first transfer material having the first transfer layer including a conductive layer; and transferring a second transfer layer onto the substrate from a second transfer material having the second transfer layer including a conductive layer such that the second transfer layer is stacked onto the first transfer layer, wherein a first conductive pattern is formed on the substrate by the conductive layer of the first transfer layer, and a second conductive pattern different from the first conductive pattern is formed on the substrate by the conductive layer of the second transfer layer such that the second conductive pattern is stacked onto the first conductive pattern, wherein a non-conductive layer is formed on a surface of at least one of the first transfer layer and the second transfer layer, the non-conductive layer being provided between the first conductive pattern and the second conductive pattern by transferring the first transfer layer and the second transfer layer onto the substrate.

According to another aspect, a layered structure is provided. The layered structure includes: a substrate; a first layer situated on the substrate and including a conductive layer defining a first conductive pattern; a second layer situated such that the second layer is stacked onto the first layer on the substrate and including a conductive layer defining a second conductive pattern different from the first conductive pattern; and a non-conductive layer having the same contour as at least one of the first conductive pattern and the second conductive pattern is situated between the conductive layer of the first layer and the conductive layer of the second layer.

According to another aspect, a touchscreen including a layered structure, and a substrate provided so as to face the layered structure is provided. The layered structure of the touchscreen includes: a second substrate separate; a first layer situated on the second substrate and including a conductive layer defining a first conductive pattern; a second layer situated such that the second layer is stacked onto the first layer on the second substrate and including a conductive layer defining a second conductive pattern different from the first conductive pattern; and a non-conductive layer having the same contour as at least one of the first conductive pattern and the second conductive pattern is situated between the conductive layer of the first layer and the conductive layer of the second layer.

DETAILED DESCRIPTION

Figure 1:
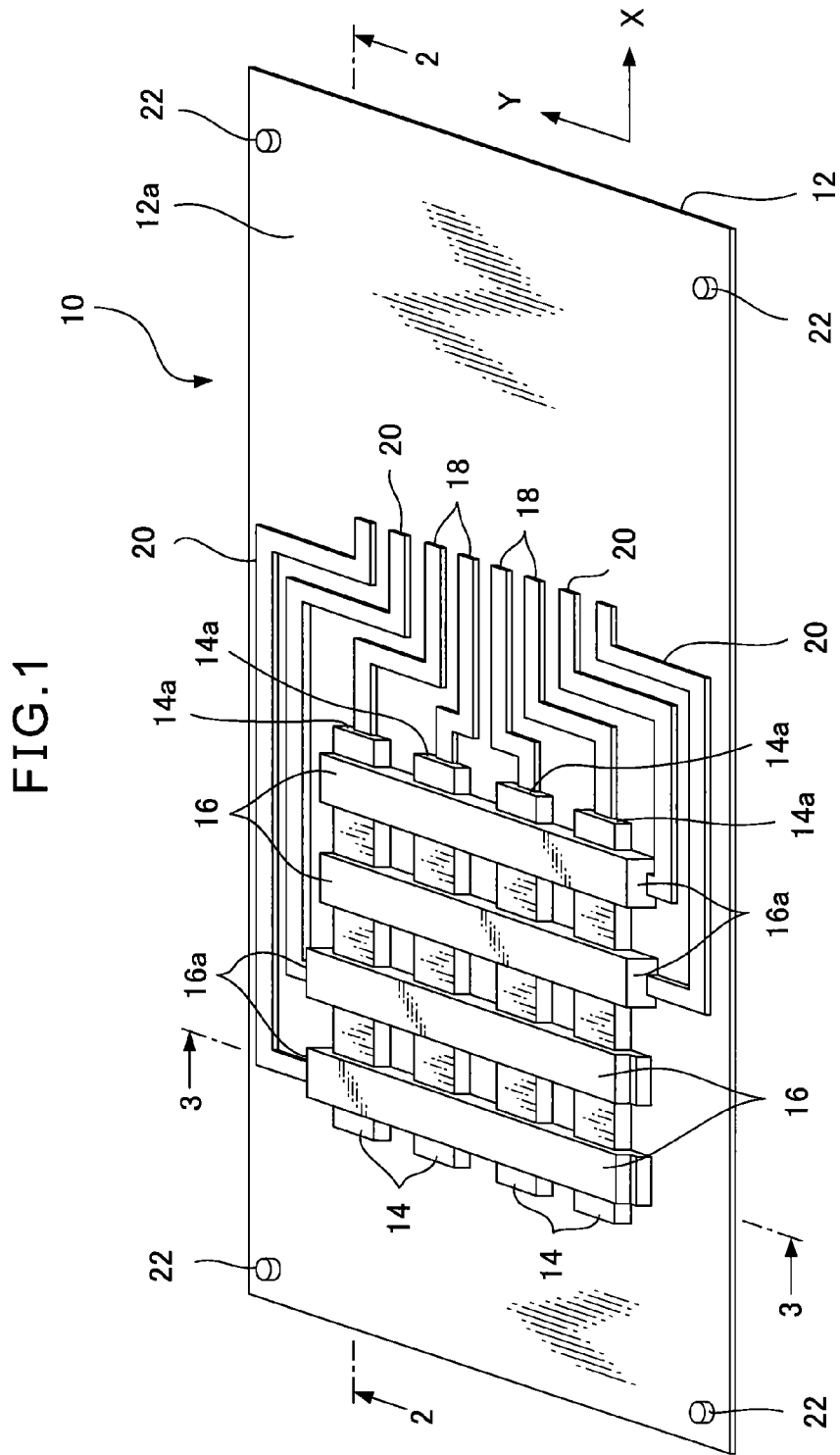
FIG. 1 is a perspective view illustrating a layered structure according to one embodiment of the present invention.
Figure 2:
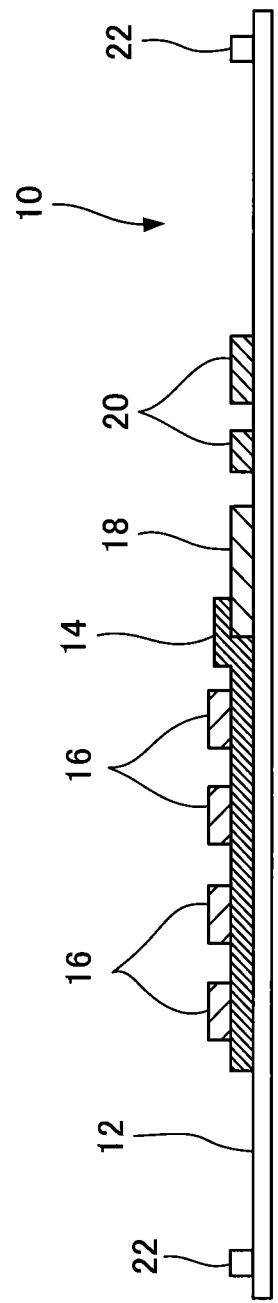
FIG. 2 is a sectional view taken along line 2-2 extending through a first transfer layer in FIG. 1.
Figure 3:
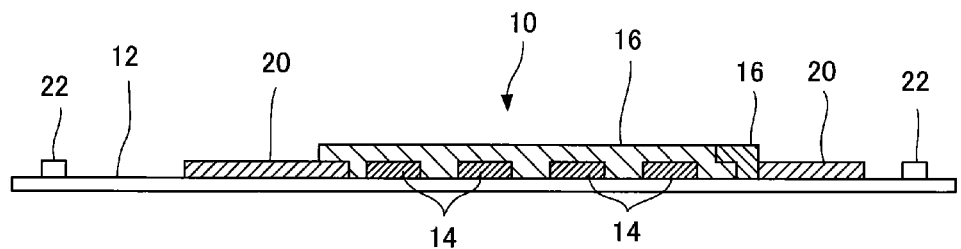
FIG. 3 is a sectional view taken along line 3-3 extending through a second transfer layer in FIG. 1.

Referring to FIGS. 1 to 3, one embodiment of the present invention will be described. FIG. 1 is a perspective view illustrating a layered structure 10 according to the embodiment. FIG. 2 is a sectional view taken along line 2-2 extending through a first transfer layer 14 in FIG. 1. FIG. 3 is a sectional view taken along line 3-3 extending through a second transfer layer 16 in FIG. 1.

The layered structure 10 shown in FIG. 1 includes a substrate 12, a first transfer layer 14 transferred onto a surface 12a of the substrate 12 and extending in an X-direction, and a second transfer layer 16 transferred onto the surface 12a of the substrate 12 and extending in a Y-direction substantially perpendicular to the X-direction. As can be best seen in FIG. 3, a part of the second transfer layer 16 is directly formed on the surface 12a of the substrate 12, while the other part thereof is formed on the first transfer layer 14 on the substrate such that the second transfer layer 16 is stacked onto the first transfer layer 14. The substrate 12 is provided with a first wire 18 extending from an end 14a of the first transfer layer 14 and a second wire 20 extending from an end 16a of the second transfer layer 16.

The layered structure 10 is an electrode layer of a touchscreen (not shown), for example. The first transfer layer 14 and the second transfer layer 16 have at least a conductive layer as further described below, and each of the conductive layers functions as an electrode extending in the X-direction or in the Y-direction. In addition to the layered structure 10, a touchscreen typically includes an additional substrate or a film provided so as to face the layered structure 10. For example, in a capacitive touchscreen, when a finger of a user touches any region over these electrodes, a position touched by the finger can be determined by detecting changes in electrostatic capacitance between the electrodes. Since configuration of such a touchscreen and technique of detecting a position touched by the finger has been widely known, further explanation thereon will be omitted.

The substrate 12 is a transparent plate formed from a glass or a plastic film such as PET (polyethylene terephthalate) film and PC (polycarbonate) film. Surfaces of the substrate 12 may also be covered with an acrylic coating, which is known as a hard coating.

A plurality of rows of the first transfer layer 14 are provided at a substantially equal distance in a direction in parallel to the X-direction, so as to function as electrodes in the X-direction of the touchscreen, for example. The first transfer layer 14 is formed on the surface 12a of the substrate 12 by transferring a transfer layer 26 from a transfer film 24 (see FIG. 4) thereto. The transfer film 24 is an example of a transfer material.

A plurality of rows of the second transfer layer 16 are provided at a substantially equal distance in a direction in parallel to the Y-direction, so as to function as electrodes in the Y-direction of the touchscreen, for example. The second transfer layer 16 is formed on the surface 12a of the substrate 12 and on a surface of the first transfer layer 14 by transferring a transfer layer 26 from the transfer film 24 thereto, similarly to the first transfer layers 14.

Although not shown in FIGS. 1 to 3, at least one of the first transfer layers 14 and the second transfer layers 16 has a layered structure including a conductive layer and a non-conductive layer extending in parallel to the surface 12a of the substrate 12 such that the conductive layer and the non-conductive layer are stacked onto each other. The conductive layer and the non-conductive layer have the same contour as each other in plan view. At least one of the first transfer layer 14 and the second transfer layer 16 has a non-conductive layer provided so as face the other of the first transfer layer 14 and the second transfer layer 16.

Accordingly, in the layered structure 10 according to the embodiment, the non-conductive layer is interposed between the conductive layer of the first transfer layer 14 and the conductive layer of the second transfer layer 16. This allows the first transfer layer 14 and the second transfer layer 16 to be electrically insulated with each other in a direction in which they are stacked onto each other. Therefore, the conductive layer of the first transfer layer 14 and the conductive layer of the second transfer layer 16 function as electrodes independently of each other. The term "insulation" or "insulate" used in the context of the present specification is not limited to the state where insulating effect is completely achieved in application of the layered structure 10, but including the state where electric resistance in a certain range, e.g., $10^6$ ohm cm or more, is achieved between the first transfer layer 14 and the second transfer layer 16.

The first wire 18 is electrically connected to the conductive layer of the first transfer layer 14. The second wire 20 is electrically connected to the conductive layer of the second transfer layer 16. The first wire 18 and the second wire 20 are formed on the surface 12a of the substrate 12 by printing silver paste by means of, for example, screen printing and then baking it thereon. In a touchscreen, for example, the first wire 18 and the second wire 20 function as connecting lines for connecting the electrodes and, for example, a controller of the touchscreen.

The substrate 12 is also provided with positioning markers 22 at the four corners of the surface 12a thereof. The positioning markers 22 serve as positioning means for positioning a photo mask for light exposure relative to the first transfer layer 14 and the second transfer layer 16, when the first transfer layer 14 and the second transfer layer 16 are formed into a certain patterned shape. The positioning marks 22 may be formed from any material. In one embodiment, the positioning marks 22 are formed from the same material as the first wire 18 and the second wire 20, such as silver paste. Such positioning marks 22 allow the first transfer layer 14 and the second transfer layer 16 to be accurately formed into a patterned shape without additional positioning means.

Figure 4:
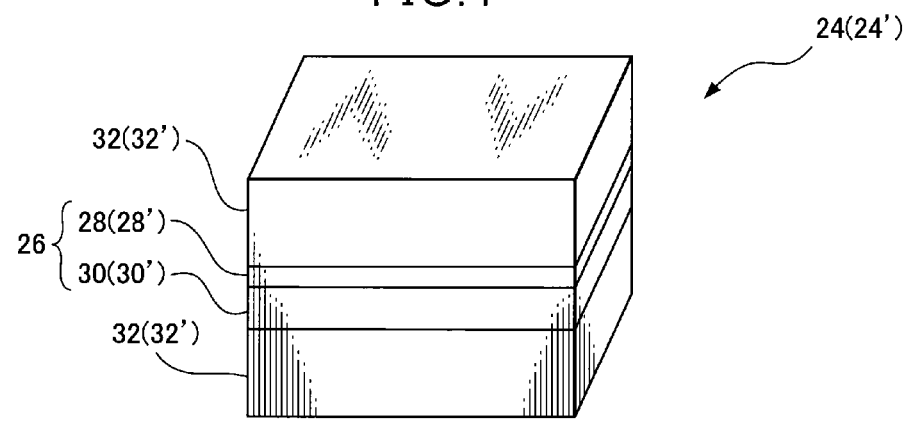
FIG. 4 is a perspective view illustrating configuration of a transfer film of the embodiment.
Figure 5:
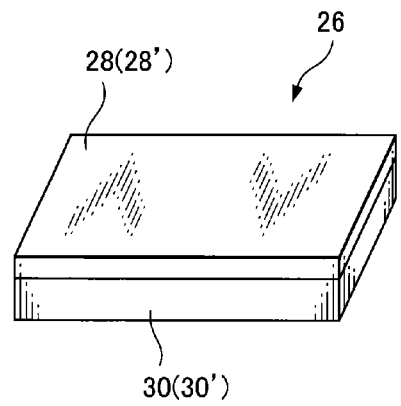
FIG. 5 is a perspective view illustrating configuration of a transfer layer transferred onto a substrate by the transfer film of FIG. 4.

Next, referring to FIGS. 4 and 5, configuration of the transfer film 24 and the transfer layer 26 transferred from the transfer film 24 will be described. FIG. 4 is a perspective view illustrating the configuration of the transfer film 24 of the embodiment. FIG. 5 is a perspective view illustrating the configuration of the transfer layer 26 transferred by using the transfer film of FIG. 4.

The exemplary transfer film 24 shown in FIG. 4 has a conductive layer 28, a non-conductive layer 30 stacked onto the conductive layer 28, and a pair of separators 32 removably provided on both surfaces of a transfer layer 26 including the conductive layer 28 and the non-conductive layer 30. The separators 32 are intended to be removed in a transfer process for transferring the transfer film 24. Accordingly, the conductive layer 28 and the non-conductive layer 30 of the transfer film 24 form the transfer layer 26 are adapted to be transferred onto, for example, the above-described substrate 12.

In one embodiment, the conductive layer 28 of the transfer film 24 is formed from a metal nanowire material. The metal nanowire material is a film-like material made of conductive ink containing a number of metal nanowires randomly dispersed therein without a particular orientational property. The metal nanowire is a minuscule metal wire having a diameter in the order from nanometers to tens of nanometers and a length in the range of micrometers to tens of micrometers. The metal nanowire material is formed by dispersing the metal nanowire in a binder such as PET ink and shaping it into a film-like member. The metal nanowire material is flexible and able to easily attach to glass and a various types of plastic films. Since the metal nanowire is so small that it cannot be recognized by human eye, the conductive layer 28 formed by the metal nanowire material is substantially transparent.

Transparent electrodes of a touchscreen according to the related art are generally formed from ITO on a glass substrate by means of sputtering. The electrode layer made of ITO has low flexibility and tends to break easily, posing a risk of disconnection upon being subject to deformation several times. In contrast, the above-described metal nanowire material has high flexibility, and therefore, it can be preferably used in an application where it is often subject to deformation in a touchscreen of an electronic paper, for example. In addition, since the metal nanowire material has an adhesive property to a glass and a plastic film, there is no need for an adhesive such as OCA (Optically Clear Adhesive). Therefore, a thinner touchscreen can be provided. Since there is no need for a process of applying an adhesive, a manufacturing process can be simplified and manufacturing cost can be reduced.

The metal nanowire material includes a number of nanowires dispersed in the binder so as to bring the nanowires into contact with one another, and therefore, has electrical conductivity as a whole. The metal nanowire is made of any metal having high electric conductivity, such as silver and copper. In particular, silver can be advantageously used to form a transparent conductive layer 28, since it allows light to transmit therethrough. Especially, when the layered structure 10 is used as electrodes of a touchscreen, it is advantageous that colors of images would not be impaired by the layered structure 10.

The non-conductive layer 30 of the transfer film 24 is made of a material such as PET having non-conductivity. The non-conductive layer 30 may be integrally formed to the conductive layer 28 or may also be formed independently of the conductive layer 28. If the conductive layer 28 and the non-conductive layer 30 are integrally formed, the metal nanowire is dispersed and deposited within a binder such as PET having non-conductivity, for example. In this way, the conductive layer 28 containing the metal nanowire and the non-conductive layer 30 not containing the metal nanowire are formed so as to be separately from each other. If the conductive layer 28 and the non-conductive layer 30 are formed independently of each other, conductive ink containing the metal nanowire is applied on the non-conductive layer 30 made of a material such as a photosensitive film having a non-conductive property, for example. In this way, the transfer layer 26 including the conductive layer 28 and the non-conductive layer 30 is obtained.

When the transfer film 24 is used, the separator 32 on the side of the transfer film 24 facing a target surface onto which the transfer layer 26 is transferred, for example, the surface 12a of the substrate 12, is removed, and then, the transfer film 24 is attached on the surface 12a of the substrate 12. The transfer film 24 in this state is pressurized while heated, so that the transfer layer 26 is transferred onto the target surface. The separator 32 on the other side is removed after the transfer process of the transfer layer 26 is completed. In this way, the transfer layer 26 having the conductive layer 28 and the non-conductive layer 30 as illustrated in FIG. 5 is transferred from the transfer film 24 onto the substrate 12. The transfer layer 26 may not have a clear boundary between the conductive layer 28 and the non-conductive layer 30. In other words, a transition part (not shown) having a property such as electrical conductivity which gradually changes may be formed between the conductive layer 28 and the non-conductive layer 30.

The transfer film 24 may also have another configuration. In one embodiment, the conductive layer 28 of the transfer film 24 is formed from a conductive polymer material. In this case, the transfer film 24 is formed by applying a conductive polymer material onto a surface of the non-conductive layer 30 such as a PET film. In the embodiment where such a conductive polymer is used, commercially available exemplary materials are SEPLEGYDA™ made by Shin-Etsu polymer Co., Ltd., or Denatron™ made by Nagase ChemteX Corp., for example.

In another embodiment, the conductive layer 28 of the transfer film 24 may be formed from a metal oxide. In one embodiment, the conductive layer 28 is formed from a layer of ITO or ZnO on a surface of the non-conductive layer 30 by means of sputtering, for example. The conductive layer 28 may be formed by applying ITO ink or ZnO ink.

In another embodiment, the conductive layer 28 of the transfer film 24 is formed from a metal patter in the form of mesh. In this case, the conductive layer 28 is formed by printing metal wires arranged in a grid on a surface of the non-conducive layer 30. Each metal wire is made of a material having a high conductive property such as silver and copper.

In another embodiment, the conductive layer 28 of the transfer film 24 may be formed from a combined material including at least two of the metal nanowire material, the silver nanowire, the conductive polymer, the metal oxide and the metal pattern in the form of mesh. For example, a layer of silver nanowire material is first formed in the above-described manner, and a conductive polymer material is then applied on a surface of the layer of silver nanowire material. Accordingly, the conductive layer 28 is formed by the combined material. With such configuration, disconnection resulting from silver nanowire being electrically charged due to static electricity can be prevented. The combined material is not limited to the combination specifically described in the present specification, but can be formed based on any combination.

According to the above embodiment, an inexpensive and thin layered structure 10 can be provided. More specifically, since a layered structure 10 can be formed without a vacuum process, an expensive facility is not required. In addition, since the first transfer layer 14 and the second transfer layer 16 can be settled without use of an adhesive, a thinner layered structure 10 can be provided. Further, the layered structure 10 without ITO does not require expensive indium, and thus reduces the cost.

Figure 6:
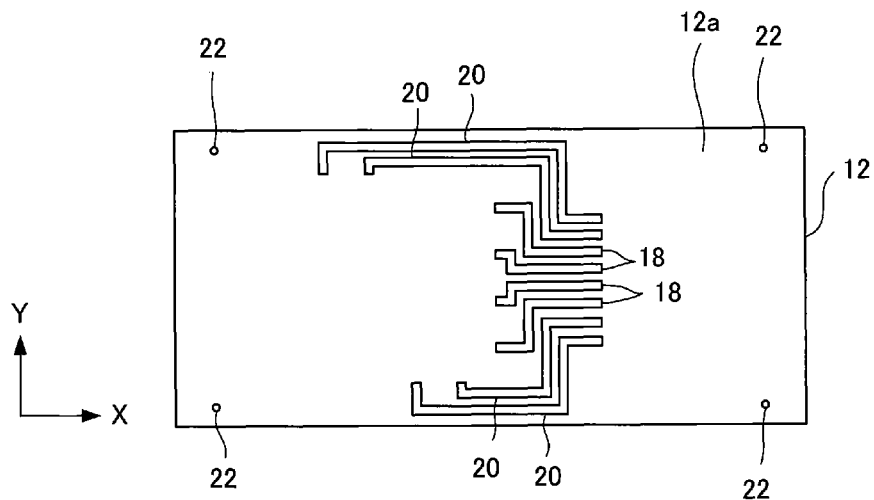
FIG. 6 is a plan view illustrating a manufacturing process for manufacturing a layered structure according to one embodiment of the present invention.
Figure 7:
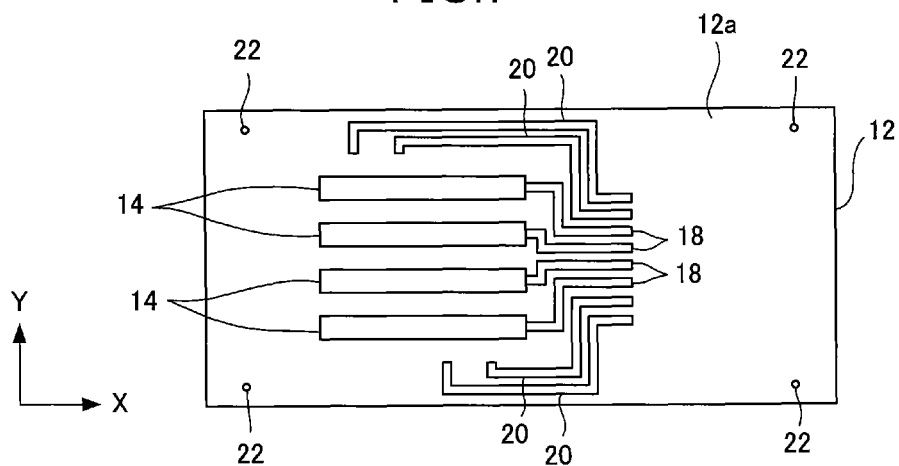
FIG. 7 is a plan view illustrating the manufacturing process for manufacturing a layered structure according to the embodiment.
Figure 8:
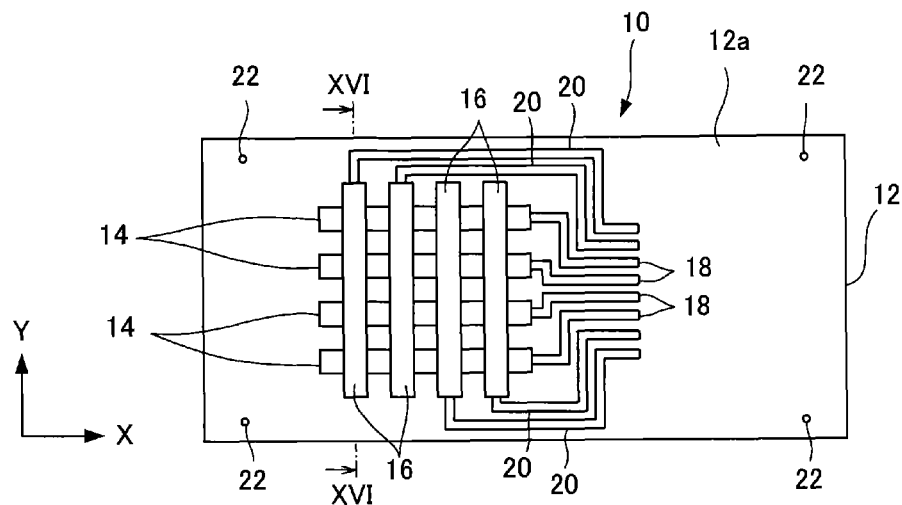
FIG. 8 is a plan view illustrating the manufacturing process for manufacturing a layered structure according to the embodiment.

Next, referring to FIGS. 6 to 8, a manufacturing process for manufacturing the layered structure 10 according to the embodiment will be described. FIGS. 6 to 8 are plan views illustrating the manufacturing process for manufacturing the layered structure 10.

First, the first wire 18 and the second wire 20 are printed on the substrate 12, as illustrated in FIG. 6, and then settled thereon by means of baking. During this process, it is preferable that the positioning marks 22 are formed simultaneously as, or continuously after the first wire 18 and the second wire 20 are formed.

Subsequently, a transfer film 24 having a first transfer layer 14 including a conductive layer 28 and a non-conductive layer 30 as illustrated in FIG. 4 is attached along the surface 12a of the substrate 12. Before this process, a separator 32 on the side of the transfer film 24 facing the substrate 12 is removed. In this embodiment, the transfer film 24 is provided such that the conductive layer 28 of the transfer film 24 faces the surface 12a of the substrate 12. Since the conductive layer 28 is oriented so as to face the substrate 12, the conductive layer 28 of the first transfer layer 14 and the first wire 18 are connected to each other.

Thereafter, the first transfer layer 14 including the conductive layer 28 and the non-conductive layer 30 is transferred from the transfer film 24 onto the substrate 12. The transfer process is carried out by pressurizing the transfer film 24 against the substrate 12, while heating up to from 100 to 140 degrees Celsius, such that the first transfer layer 14 is laminated on the surface 12a of the substrate 12. After the transfer process of the first transfer layer 14 is completed, the other separator 32 is removed from the surface of the non-conductive layer 30 of the first transfer layer 14.

The transfer layer 14 transferred onto the substrate 12 is formed into a certain patterned shape by means of known technique. In the illustrated example in FIG. 7, the first transfer layer 14 is formed into a plurality of rows extending in parallel to the X-direction. Although only four rows of the first transfer layer 14 are shown in FIG. 7, the first transfer layer 14 can be formed in more than four rows when used as electrodes of a touchscreen. The pattern forming can be accurately performed by means of known photolithography. The pattern forming is implemented, for example, by irradiating ultraviolet light on the transfer film 24 having photosensitivity and by developing the patterned shape with 1% alkali solution, for example, $Na_2CO_3$. In this pattern forming process, the positioning marks 22 are used to position a mask for light exposure relative to the transfer layer 14.

Figure 17:
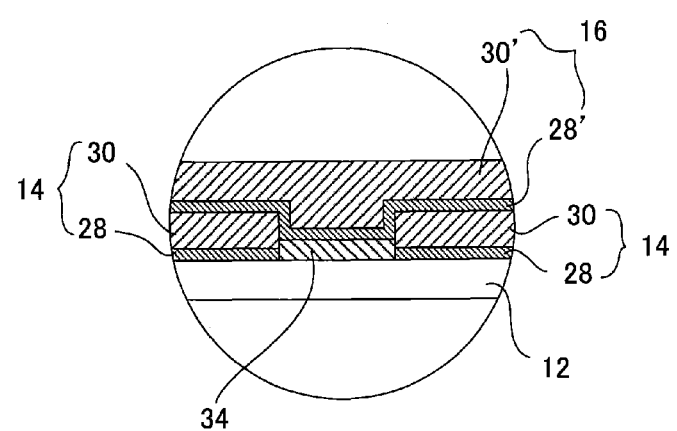
FIG. 17 is an enlarged view illustrating a portion XVII in FIG. 16.

A non-conductive material is applied on the side surface of the transfer layer 14 formed into a certain patterned shape on the substrate 12, so as to form a non-conductive coating 34, as illustrated in FIG. 17. The non-conductive coating 34 is formed so as to cover at least the side surface of the conductive layer 28 of the first transfer layer 14.

A transfer film 24' having the same form as the transfer film 24 used to form the first transfer layer 14 is then attached on the surface 12a of the substrate 12 and the surface of the first transfer layer 14. The transfer film 24' is attached such that the conductive layer 28' thereof faces the surface of the first transfer layer 14, i.e., the non-conductive layer 30 of the first transfer layer 14. Before the attachment of the transfer film 24', a separator 32' on the side of the transfer film 24' facing the substrate 12 is removed. The transfer film 24' has enough flexibility that it can deform in accordance with rough portions locally formed by the transfer film 14. As a result, the transfer film 24' is tightly attached on the surface of the first transfer layer 14. By the transfer film 24' attached in this manner, the second transfer layer 16 including a conductive layer 28' and a non-conductive layer 30' is transferred onto the surface 12a of the substrate 12 and the surface of the first transfer layer 14. The transfer process of the second transfer layer 16 is carried out in the same way as described in relation to the first transfer layer 14. The other separator 32' of the transfer film 24' is removed after the transfer process of the second transfer layer 16.

Subsequently, the second transfer layer 16 is formed into a certain patterned shape as exemplified in FIG. 8. The second transfer layer 16 in FIG. 8 is formed into a patterned shape, so as to extend as in a plurality of rows extending in parallel to the Y-direction perpendicular to the X-direction. The second transfer layer 16 is provided such that the conductive layer 28' thereof faces the substrate 12, and therefore, the conductive layer 28' is electrically connected to the second wire 20. The pattern forming of the second transfer layer 16 is implemented in the same way as described in relation to the pattern forming of the first transfer layer 14.

Figure 16:
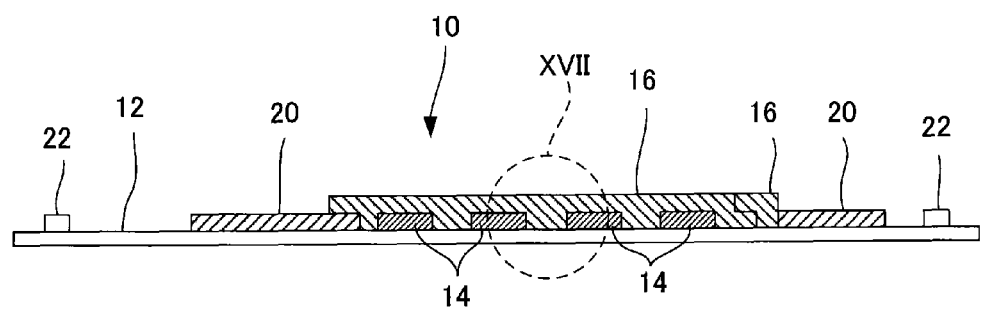
FIG. 16 is a sectional view taken along line XVI-XVI in FIG. 8.

FIG. 16 is a sectional view taken along line XVI-XVI in FIG. 8. FIG. 17 is an enlarged view illustrating a portion XVII in FIG. 16. FIG. 17 shows the conductive layers 28 and 28' and the non-conductive layers 30 and 30' of the first transfer layer 14 and the second transfer layer 16, which are omitted in FIG. 16. As can be seen in FIG. 17, in the layered structure 10 manufactured in the way according to the above embodiment, the non-conductive layer 30 of the first transfer layer 14 defines a surface facing the second transfer layer 16. In addition, the non-conductive coating 34 is formed on the side surface of the conductive layer 28 of the first transfer layer 14. In this way, the conductive layer 28 of the first transfer layer 14 and the conductive layer 28' of the second transfer layer 16 are electrically insulated from each other. Since the manufacturing process which uses the transfer films 24 and 24' does not involve a vacuum process, it is inexpensive, compared to the conventional process in which electrodes are formed from ITO by means of sputtering. Further, since there is no need for use of an adhesive, the process can be simplified. Furthermore, the patterned shapes of the first transfer layer 14 and the second transfer layer 16 can be formed after the first transfer layer 14 and the second transfer layer 16 are transferred onto the substrate 12. This prevents the first transfer layer 14 and the second transfer layer 16 from being misaligned relative to each other, and thus, resulting in an improved yield rate.

Figure 9:
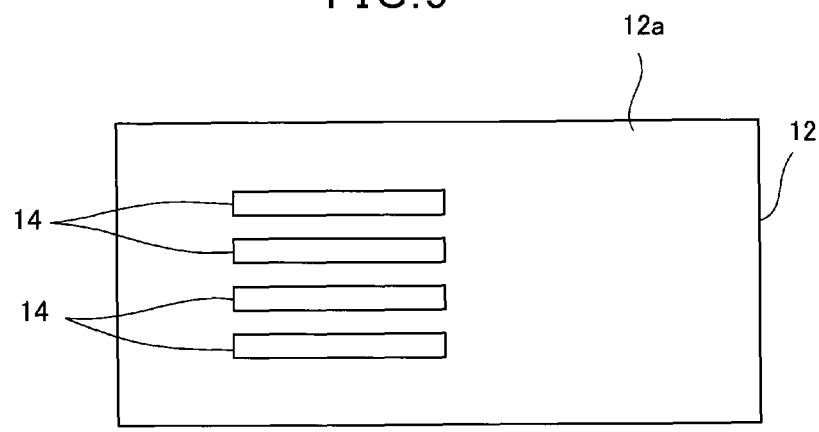
FIG. 9 is a plan view illustrating a manufacturing process for manufacturing a layered structure according to another embodiment of the present invention.
Figure 10:
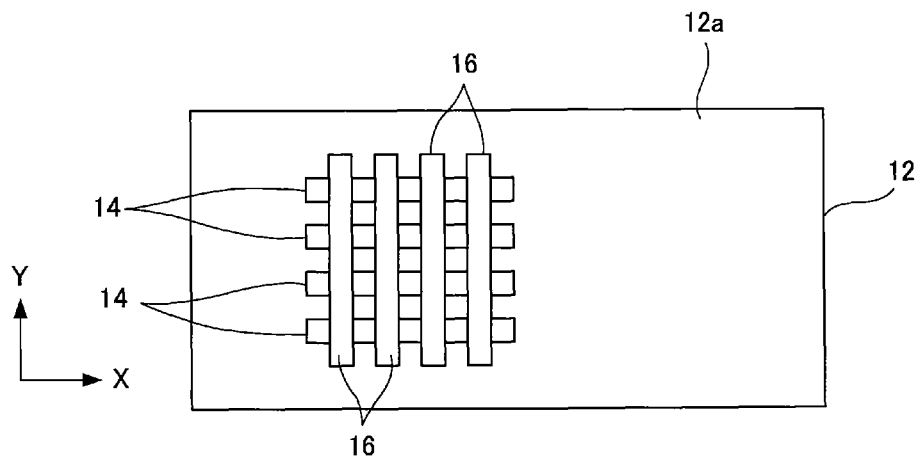
FIG. 10 is a plan view illustrating the manufacturing process for manufacturing a layered structure according to the embodiment.
Figure 11:
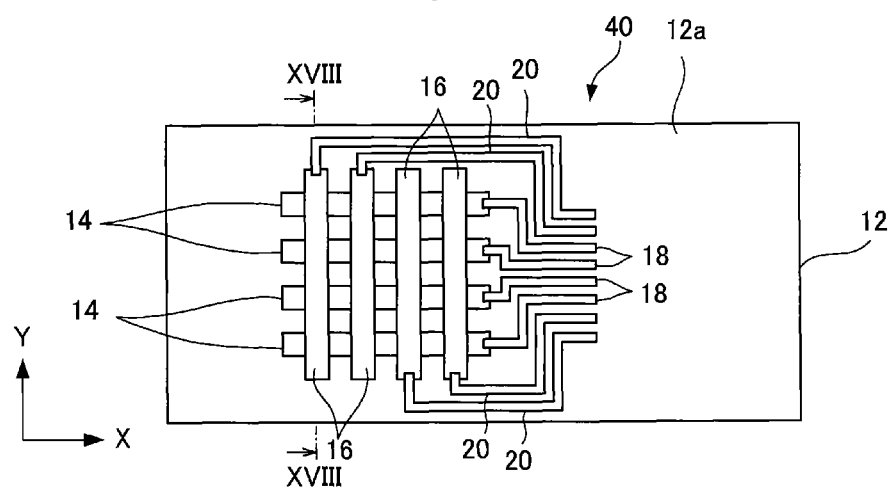
FIG. 11 is a plan view illustrating the manufacturing process for manufacturing a layered structure according to the embodiment.

Next, referring to FIGS. 9 to 11, a manufacturing process for manufacturing a layered structure 40 according to another embodiment will be described. FIGS. 9 to 11 are plan views illustrating the process of the manufacturing process of the layered structure 40. In the manufacturing process, the transfer film 24 is attached on the surface 12a of the substrate 12 with one of the separators 32 removed, as described above. In this embodiment, the transfer film 24 is provided such that the non-conductive layer 30 faces the surface 12a of the substrate 12. As described in relation to the above embodiment, the first transfer layer 14 including the conductive layer 28 and the non-conductive layer 30 is transferred from the transfer films 24 onto the substrate 12. After the transfer process of the first transfer layer 14, the other of the separators 32 of the transfer film 24 which has been attached on the side of the conductive layer 28 of the first transfer layer 14 is removed. Thereafter, the first transfer layer 14 is formed into a certain patterned shape on the substrate 12, as exemplified in FIG. 9. In the illustrated example, the first transfer layer 14 is formed into a plurality of rows extending in parallel to the X-direction at an equal distance relative to each other.

A transfer film 24' having the same form as the transfer film 24 used to form the first transfer layer 14 is then attached on the surface 12a of the substrate 12 and the surface of the first transfer layer 14. Before the attachment of the transfer film 24', a separator 32' on the side of the transfer film 24' facing the substrate 12 is removed. In this embodiment, the transfer film 24' is provided such that the non-conductive layer 30' thereof faces the surface of the first transfer layer 14. The second transfer layer 16 including the conductive layer 28' and the non-conductive layer 30' is transferred from the attached transfer film 24' onto the first transfer layer 14 on the substrate 12 such that the second transfer layer 16 is stacked onto the first transfer layer 14. After the transfer process of the second transfer layer 16, a separator 32' on the conductive layer 28' of the second transfer layer 16 is removed. The second transfer layer 16 is then formed into a certain patterned shape on the substrate 12, as exemplified in FIG. 10. In the illustrated example, the second transfer layer 16 is formed into a plurality of rows extending in parallel to the Y-direction at an equal distance relative to each other.

Finally, silver paste is printed and baked so as to form the first wire 18 and the second wire 20 as illustrated in FIG. 11. The conductive layer 28 of the first transfer layer 14 and the conductive layer 28' of the second transfer layer 16 are provided on the side distant from the substrate 12. Accordingly, the first wire 18 is electrically connected to the conductive layer 28 of the first transfer layer 14, and the second wire 20 is electrically connected to the conductive layer 28' of the second transfer layer 16.

Figure 18:
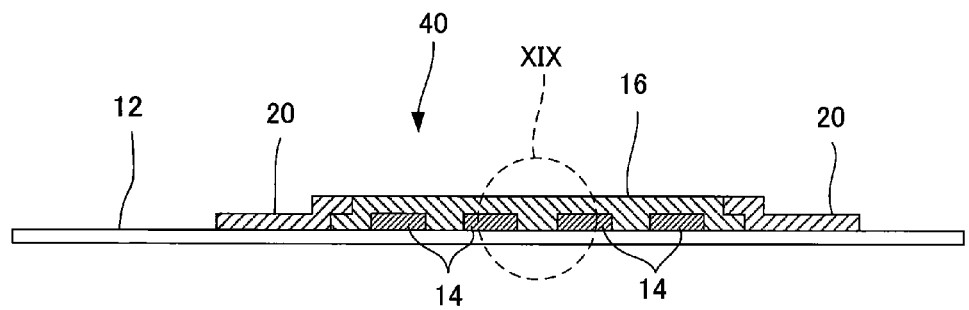
FIG. 18 is a sectional view taken along line XVIII-XVIII in FIG. 11.
Figure 19:
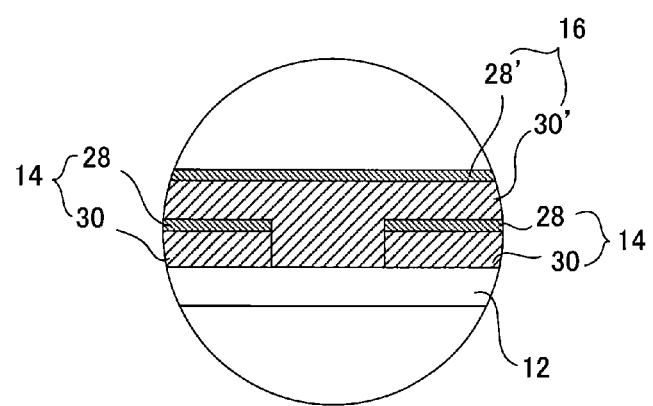
FIG. 19 is an enlarged view illustrating a portion XIX in FIG. 18.

FIG. 18 is a sectional view taken along line XVIII-XVIII in FIG. 11. FIG. 19 is an enlarged view illustrating a portion XIX in FIG. 18. FIG. 19 shows the conductive layers 28 and 28' and the non-conductive layers 30 and 30' of the first transfer layer 14 and the second transfer layer 16, which are omitted in FIG. 18. As can be seen in FIG. 19, in the layered structure 40 according to this embodiment, the non-conductive layer 30' of the second transfer layer 16 extends between the conductive layer 28 of the first transfer layer 14 and the conductive layer 28' of the second transfer layer 16. Therefore, the conductive layer 28 of the first transfer layer 14 and the conductive layer 28' of the second transfer layer 16 are electrically insulated from each other. The manufacturing process according to this embodiment does not require a vacuum process and adhesive, as described above. Accordingly, the process can be simplified and an inexpensive manufacturing process can be provided.

Figure 12:
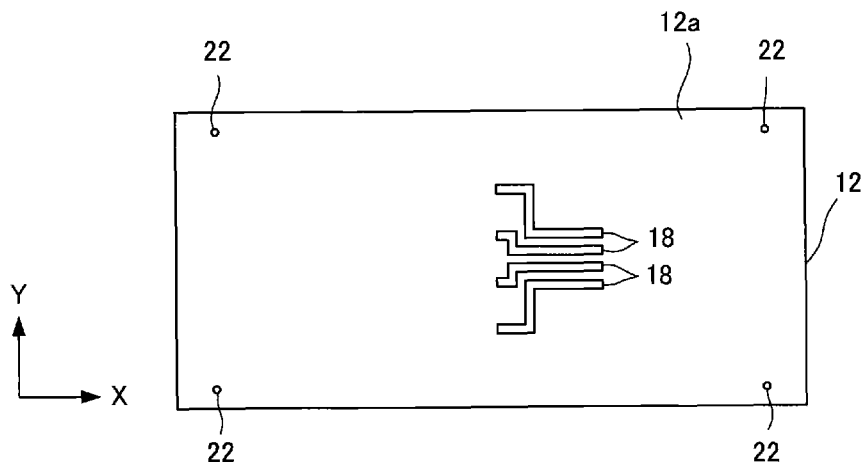
FIG. 12 is a plan view illustrating a manufacturing process for manufacturing a layered structure according to yet another embodiment of the present invention.

Next, referring to FIGS. 12 to 15, a manufacturing process for manufacturing a layered structure 50 according to another embodiment will be described. FIGS. 12 to 15 are plan views illustrating the process of the manufacturing process of the layered structure 50. In the manufacturing process, silver paste is first printed and baked so as to form the first wire 18, as shown in FIG. 12. In addition, the positioning marks 22 are formed at the four corners of the substrate 12 with the same material as the first wire 18, either in a single step or separate steps.

Figure 13:
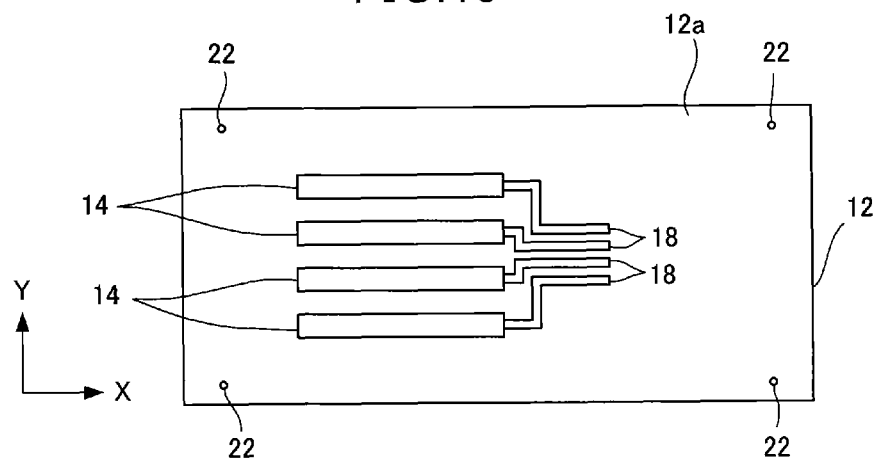
FIG. 13 is a plan view illustrating the manufacturing process for manufacturing a layered structure according to the embodiment.

The above-described transfer film 24 is then attached to the substrate 12. Before the attachment of the transfer film 24, the separator 32 on the side of the transfer film 24 facing the substrate 12 is removed. In this embodiment, the transfer film 24 is provided such that the conductive layer 28 of the transfer film 24 faces the surface 12a of the substrate 12. As described in relation to the above embodiment, the first transfer layer 14 including the conductive layer 28 and the non-conductive layer 30 is transferred from the transfer film 24 onto the substrate 12. After the transfer process of the first transfer layer 14, the other separator 32 is removed. The transfer layer 14 is then formed into a certain patterned shape on the substrate 12 by means of, for example, photolithography, as illustrated in FIG. 13. Since the conductive layer 28 of the first transfer layer 14 faces the substrate 12, the conductive layer 28 is electrically connected to the first wire 18 formed in the earlier process. When the first transfer layer 14 is formed into a patterned shape, a photo mask for light exposure can be positioned relative to the first transfer layer 14 by means of the positioning marks 22.

Figure 14:
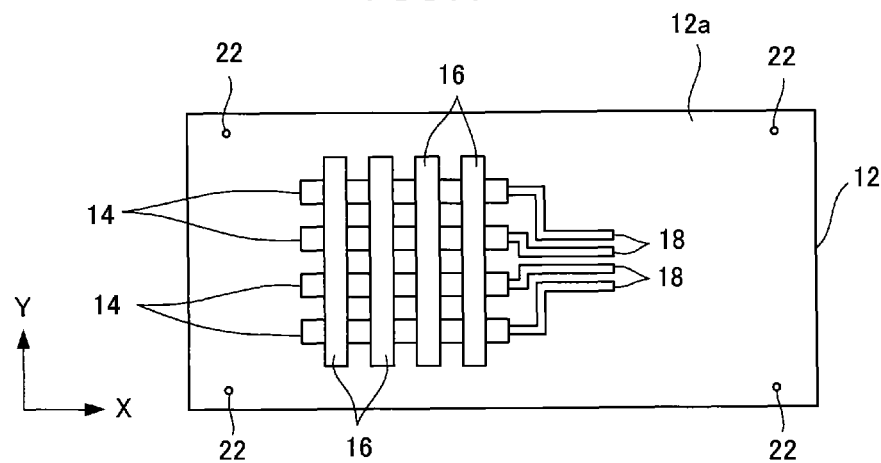
FIG. 14 is a plan view illustrating the manufacturing process for manufacturing a layered structure according to the embodiment.

Subsequently, a transfer film 24' having the same form as the transfer film 24 used to form the first transfer layer 14 is attached on the surface 12a of the substrate 12 and the surface of the first transfer layer 14. Before the attachment of the transfer film 24', a separator 32' on the side of the transfer film 24' facing the substrate 12 is removed. In this embodiment, the transfer film 24' is provided such that the non-conductive layer 30' thereof faces the surface of the first transfer layer 14. The second transfer layer 16 including the conductive layer 28' and the non-conductive layer 30' is transferred from the attached transfer film 24 onto the first transfer layer 14 on the substrate 12 such that the second transfer layer 16 is stacked onto the first transfer layer 14. After the transfer process of the second transfer layer 16, a separator 32' on the other side is removed. The second transfer layer 16 is then formed into a certain patterned shape on the substrate 12 by means of, for example, photolithography, as illustrated in FIG. 14. When the second transfer layer 16 is formed into a patterned shape, a photo mask for light exposure can be positioned relative to the second transfer layer 16 by means of the positioning marks 22.

Finally, silver paste is printed and baked so as to form the second wire 20. In this embodiment, the conductive layer 28' of the second transfer layer 16 is provided on the side distant from the substrate 12. Accordingly, the second wire 20 is electrically connected to the conductive layer 28' of the second transfer layer 16.

Figure 15:
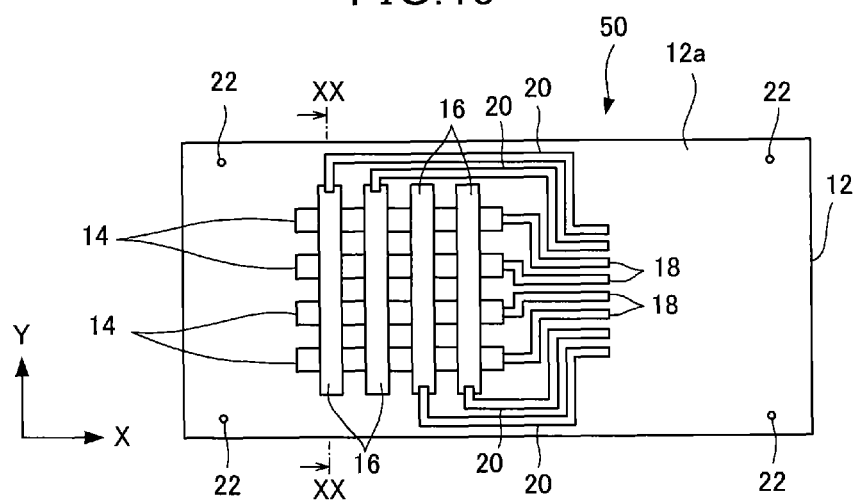
FIG. 15 is a plan view illustrating the manufacturing process for manufacturing a layered structure according to the embodiment.
Figure 20:
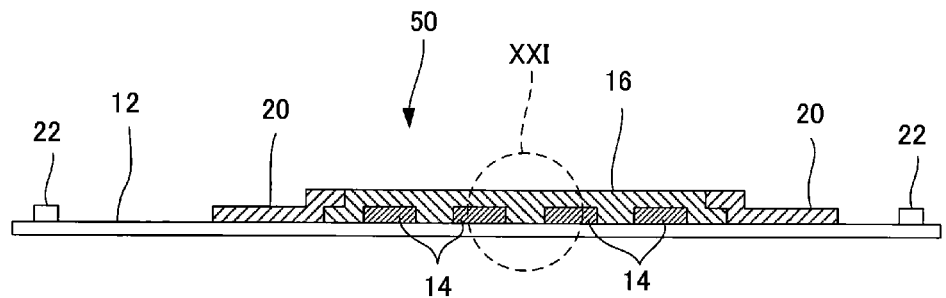
FIG. 20 is a sectional view illustrating taken along line XX-XX in FIG. 15.
Figure 21:
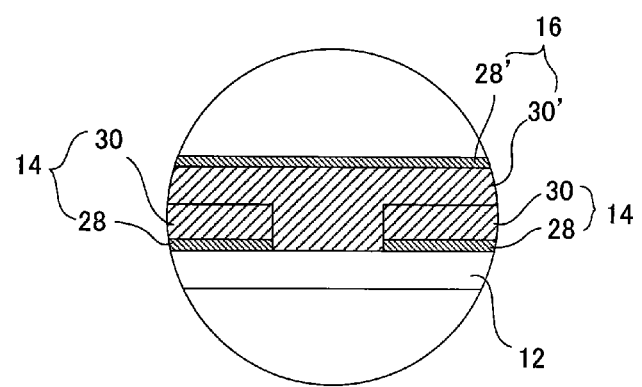
FIG. 21 is an enlarged view illustrating a portion XXI in FIG. 20.

FIG. 20 is a sectional view taken along line XX-XX in FIG. 15. FIG. 21 is an enlarged view illustrating a portion XXI in FIG. 20. FIG. 21 shows the conductive layers 28 and 28' and the non-conductive layers 30 and 30' of the first transfer layer 14 and the second transfer layer 16, which are omitted in FIG. 20. As can be seen in FIG. 21, in the layered structure 50 according to this embodiment, the non-conductive layers 30 and 30' of the first transfer layer 14 and the second transfer layer 16 extend between the conductive layer 28 of the first transfer layer 14 and the conductive layer 28' of the second transfer layer 16. Therefore, the conductive layer 28 of the first transfer layer 14 and the conductive layer 28' of the second transfer layer 16 are electrically insulated from each other. The manufacturing process according to this embodiment does not require a vacuum process and adhesive, either, similarly to the manufacturing process according to the above embodiment. Accordingly, the process can be simplified and an inexpensive manufacturing process can be provided.

In the above exemplary embodiments, both the first transfer layer and the second transfer layer include the conductive layer and the non-conductive layer. However, other embodiments are also possible in order to insulate the first transfer layer and the second transfer layer from each other.

For example, either one of the first transfer layer and the second transfer layer may include a conductive layer and a non-conductive layer as described above, while the other of the first transfer layer and the second transfer layer may include only the conductive layer. The transfer layer including only the conductive layer can be formed in the way as described above or other known technique. In the case of the layered structure having such configuration, the non-conductive layer of one of the transfer layers is provided so as face the other of the transfer layers. In this way, insulation between the transfer layers is ensured.

In the above embodiments, after the transfer processes of the first transfer layer and the second transfer layer, the first transfer layer and the second transfer layer are formed into the patterned shapes on the substrate by means of known technique such as photolithography. However, the present invention is not limited to such an embodiment. For example, the transfer layer in the transfer film may include the first transfer layer and the second transfer layer which already have a certain patterned shape. In this case, simply by transferring the transfer layer from the transfer film, the first transfer layer and the second transfer layer having a certain patterned shape can be formed on the substrate.

What is claimed is:
1. A layered structure comprising:
a substrate;

a first layer situated on the substrate and including a conductive layer defining a first conductive pattern;

a second layer situated such that the second layer is stacked onto the first layer on the substrate and including a conductive layer defining a second conductive pattern different from the first conductive pattern; and a non-conductive layer having the same contour as at least one of the first conductive pattern and the second conductive pattern is situated between the conductive layer of the first layer and the conductive layer of the second layer.

2. The layered structure according to claim 1, wherein at least one of the first conductive pattern and the second conductive pattern is formed from a silver nanowire material.

3. A touchscreen comprising a layered structure, and a substrate provided so as to face the layered structure, the layered structure comprising:

a second substrate separate;

a first layer situated on the second substrate and including a conductive layer defining a first conductive pattern;

a second layer situated such that the second layer is stacked onto the first layer on the second substrate and including a conductive layer defining a second conductive pattern different from the first conductive pattern; and a non-conductive layer having the same contour as at least one of the first conductive pattern and the second conductive pattern is situated between the conductive layer of the first layer and the conductive layer of the second layer.

4. A manufacturing process for manufacturing a layered structure having layered conductive patterns, the manufacturing process comprising:

transferring a first transfer layer onto a substrate from a first transfer material having the first transfer layer including a conductive layer; and transferring a second transfer layer onto the substrate from a second transfer material having the second transfer layer including a conductive layer such that the second transfer layer is stacked onto the first transfer layer, wherein a first conductive pattern is formed on the substrate by the conductive layer of the first transfer layer, and a second conductive pattern different from the first conductive pattern is formed on the substrate by the conductive layer of the second transfer layer such that the second conductive pattern is stacked onto the first conductive pattern, wherein a non-conductive layer is formed on a surface of at least one of the first transfer layer and the second transfer layer, the non-conductive layer being provided between the first conductive pattern and the second conductive pattern by transferring the first transfer layer and the second transfer layer onto the substrate.

5. The manufacturing process according to claim 4, wherein at least one of the conductive layers of the first transfer layer and the second transfer layer is formed from a metal nanowire material.

6. The manufacturing process according to claim 5, wherein the metal nanowire material is silver.

7. The manufacturing process according to claim 4, wherein at least one of the conductive layers of the first transfer layer and the second transfer layer is formed from a conductive polymer material.

8. The manufacturing process according to claim 4, wherein at least one of the conductive layers of the first transfer layer and the second transfer layer is formed from a metal oxide.

9. The manufacturing process according to claim 4, wherein at least one of the conductive layers of the first transfer layer and the second transfer layer is formed from a metal pattern in the form of mesh.

10. The manufacturing process according to claim 4, wherein at least one of the conductive layers of the first transfer layer and the second transfer layer is formed from a combined material including at least two of a metal nanowire material, a silver nanowire material, a conductive polymer material, a metal oxide and a metal pattern in the form of mesh.

11. The manufacturing process according to claim 4, wherein the conductive layer of the first transfer layer is shaped by means of photolithography to form the first conductive pattern, and the conductive layer of the second transfer layer is shaped by means of photolithography to form the second conductive pattern.

* * * * *